United States Patent [19]

Ueno

[11] Patent Number: 5,331,194
[45] Date of Patent: Jul. 19, 1994

[54] BIPOLAR STATIC INDUCTION TRANSISTOR

[75] Inventor: Katsunori Ueno, Matsumoto, Japan

[73] Assignee: Fuji Electric Co., Ltd., Kawasaki, Japan

[21] Appl. No.: 969,757

[22] Filed: Oct. 30, 1992

[30] Foreign Application Priority Data

Oct. 30, 1991 [JP] Japan .................................. 3-283369

[51] Int. Cl.$^5$ ............................................ H01L 29/72
[52] U.S. Cl. ...................................... 257/498; 257/197; 257/364; 257/378; 257/379; 257/539; 257/577
[58] Field of Search ............... 257/498, 364, 378, 379, 257/539, 577, 197

[56] References Cited

U.S. PATENT DOCUMENTS 5,045,909  9/1991  Lucek et al. ......................... 257/378
5,178,370  1/1993  Clark et al. .......................... 257/378

OTHER PUBLICATIONS

IEDM Technical Digest 1978, pp. 676–679.
Japanese Journal of Applied Physics 17 (1978), pp. 245–246.
IEEE Electron Device Letters EDL-6 (1985), pp. 522–524.
CMOS compatible 250 V Lateral Insulated Base Transistors, Narayanan et al. pp. 181–186, Engineering Dept., University of Cambridge.

*Primary Examiner*—Edward Wojciechowicz
*Attorney, Agent, or Firm*—Brumbaugh, Graves, Donohue & Raymond

[57] ABSTRACT

In a bipolar static induction transistor (BSIT) with increased input impedance, gate-voltage control is used for switching operations. The BSIT includes a collector region, a base region, an emitter region, and a source region in the base region. For enhanced turn-off, an auxiliary base region is included; alternatively, a drain region is provided in the base region.

6 Claims, 2 Drawing Sheets

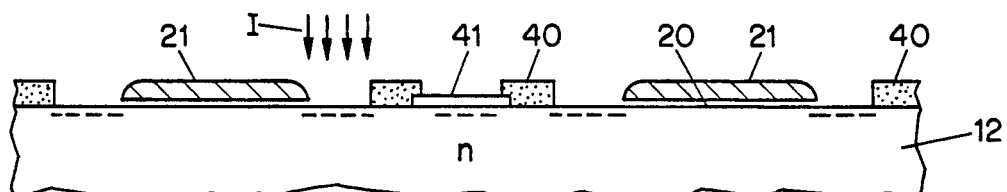
FIG. 3(a)
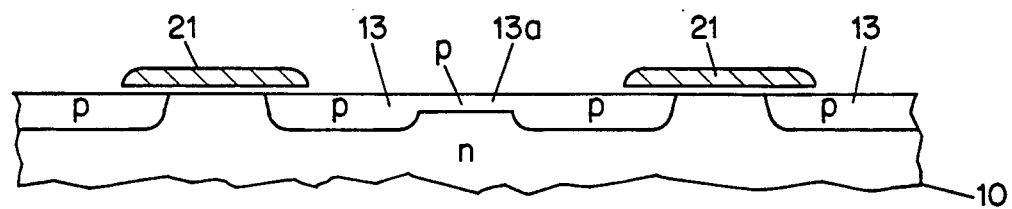
FIG. 3(b)
FIG. 3(c)
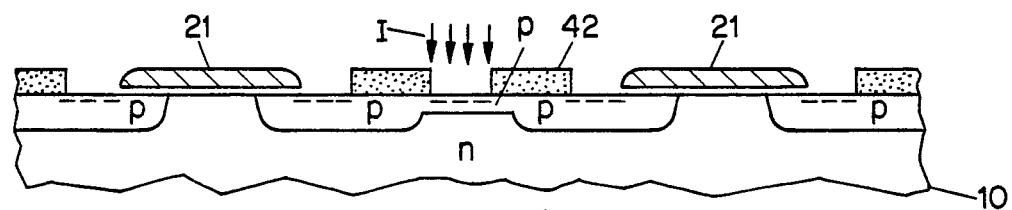
FIG. 3(d)
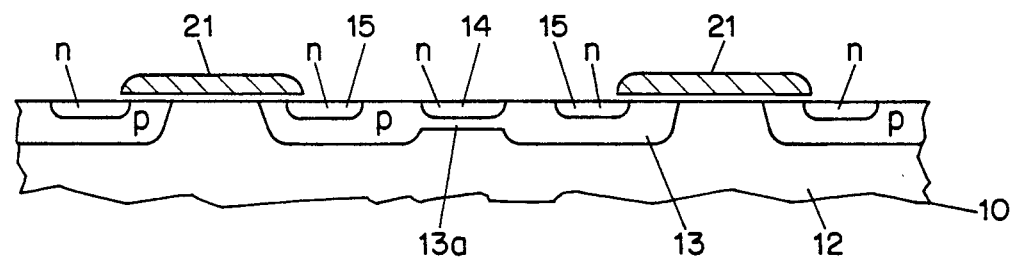
FIG. 4

BIPOLAR STATIC INDUCTION TRANSISTOR

BACKGROUND OF THE INVENTION

The invention relates to a static induction or field-effect bipolar transistor with voltage control, suitable for high-voltage or high-current operations.

A conventional bipolar transistor has a three-layer structure such as NPN or a PNP structure in which an emitter-collector current is controlled by a base current. The current-amplification factor, a measure for the transistor's control performance, is determined by the base width, i.e., the thickness of the base layer along the current-flow direction. The current-amplification factor can be increased by narrowing the base width, thereby enhancing the control performance. By incorporating a base having substantially zero width, and by using a static induction or magnetic field effect, control performance is greatly improved over the conventional bipolar transistor; see IEDM Technical Digest, 1978, p. 676; Japanese Journal of Applied Physics 17 (1978), p. 245; and IEEE Electron Device Letters EDL-6 (1985), p. 522. These articles variously describe transistor structures designated as BSIT, DBT and EMFET. As used in the following, the designation BSIT stands for bipolar static induction transistor.

Basic structure and operation of a conventional BSIT are briefly explained hereunder with reference to FIG. 4. A semiconductor body 10 for the BSIT 30 consists of an n-type epitaxial layer 12 several tens of micrometers thick as a collector region on an n+-type substrate 11, for example. Two p-type base regions 13 are formed by diffusion at the surface of the collector region 12, with the thickness of the base regions 13 being greater than in earlier conventional structures, as shown in FIG. 4. An n+-type emitter region 14 is diffused at the surface of the collector region 12, between the two base regions 13. A collector terminal C, an emitter terminal E, and a base terminal B are respectively connected, via electrode films 25, to the substrate 11, the emitter region 14, and the base regions 13.

For the sake of exposition, FIG. 4 shows a hypothetical base region 13a below the emitter region 14. If a base region 13a were actually present, the structure of a vertical NPN transistor would be realized. Substantially lacking a base region 13a, the BSIT 30 has minimized base width (which is the thickness of the base region 13a), and a static induction effect is utilized by which the collector region 12 is influenced by the two surrounding base regions 13.

When the BSIT 30 is turned off, a depletion region extends from a p-n junction between the collector region 12 and the base regions 13, mainly towards the collector region 12, because of a positive voltage applied to the collector terminal C. When a base current flows into the base regions 13 from the base terminal B, a hole current h flows into the emitter region 14 from the base region 13 through the p-n junction in the forward direction. An electron current e is generated from the emitter region 14 in correspondence with this current flow. Part of this current e flows into the base region 13 through the p-n junction, but most of the electrons flow into the collector region 12 because of the static induction or electric field effect of the collector region 12. As a result, there is conduction between the collector and the emitter. To switch from this on-state to the off-state, a reverse bias is applied between the base region 13 and the collector region 12 via the base terminal B, thereby expanding the depletion region, with the current in the collector region 12 from the p-n junction generated from both sides of the p-n junction.

In a BSIT 30 with the aforementioned basic structure and operation, because the width of the hypothetical base region 13a is infinitesimally small, a high current-amplification factor can be realized. The vertical construction allows increased thickness of the collector region 12 and extension of the depletion at turn-off, thereby allowing the transistor to withstand high voltages. If this BSIT 30 is compared with a field-effect transistor, the collector, emitter and the base correspond to drain, source and gate, respectively.

As described, a BSIT has an advantageously high current-amplification factor. However, in a BSIT, the current between the collector and the emitter, or the on-off states, are controlled by the base current. Thus, from the point of view of circuit control, a BSIT more closely resembles a bipolar transistor than a field-effect transistor. The low output impedance of the BSIT is an advantage, but the low input impedance is a disadvantage. Furthermore, to increase the current-carrying capacity, a plurality of unit structures (per FIG. 4) are connected in parallel on a common substrate, for example. In this case, as the current tends to concentrate on particular unit structures, such structures may be damaged due to overcurrent.

SUMMARY OF THE INVENTION

In accordance with an aspect of the invention, drawbacks of a conventional BSIT are overcome in a BSIT with voltage control.

A preferred first embodiment of the invention includes a collector region of first conductivity type, a base region of second conductivity type diffused from the surface of the collector region, an emitter region of first conductivity type diffused into the surface portion of the base region, a source region of first conductivity type diffused into a surface portion of the base region, and a gate disposed at least above a portion of the base region between the surface of the collector region and the source region. The current flowing between the collector region and the emitter region is controlled by a voltage applied to the gate with the base region and the source region short-circuited. For BSIT operation, and rapid turn-off in particular, it is desirable that an auxiliary base region of the second conductivity type be diffused to a shallow depth across the collector region, below the emitter region. Preferably, the auxiliary base region has an impurity concentration which is lower by at least an order of magnitude as compared with the base region.

A preferred second embodiment of the invention includes a collector region, a base region, an emitter region and a source region formed in the base region, having the same conductivity types as the corresponding regions of the first embodiment. A first gate is disposed on the portion of the base region between the surface of the collector region and the source region, a drain region of first conductivity type is formed by diffusion in the portion of the base region located between the emitter region and the source region, and a second gate is disposed on the portion of the base region between the emitter region and the drain region. In this embodiment, the current flowing between the collector region and the emitter region is controlled for transistor turn-on and turn-off, by controlling the voltage applied to the first and second gates, with the source region and the drain region short-circuited with the base region. Instead of independent source and drain regions, a common source/drain region may be included.

Preferably, in the manufacture of preferred embodiments, gate contacts are formed first. Preferably also, base regions are formed by ion implantation of a suitable impurity, utilizing the gate contacts for masking, followed by thermal diffusion. The source region or the drain region is preferably formed by ion implantation of a suitable impurity simultaneously with the formation of the emitter region.

In the preferred first embodiment, a field-effect transistor with the collector region as drain region is formed between the base region and the source region. Then, with the source region short-circuited with the base region, and with a source voltage applied to the source region, a current flowing from the collector region to the source region can be controlled by gate-voltage control to turn the BSIT on. This BSIT can be turned off in the same manner as a conventional transistor, but the turn-off operation takes somewhat longer as compared with a conventional transistor. Preferably, for accelerated turn-off, an auxiliary base region of the same conductivity type as the base region is disposed between the collector and emitter regions.

As in the preferred first embodiment, in the preferred second embodiment a field-effect transistor is disposed between the source region and the collector region, for turn-on of the BSIT by controlling the voltage applied to the first gate. For enhanced turn-off, the drain region is formed in the base region, and a separate field-effect transistor is disposed between the drain region and the emitter region. The main transistor is turned on by second-gate voltage. Carriers due to the base current flowing into the base region are drawn out into the emitter region, thereby accelerating BSIT turn-off. The source region and the drain region in the second preferred embodiment are short-circuited with the base region.

BRIEF DESCRIPTION OF THE DRAWINGS

FIGS. 3(a) to 3(d) are cross sections of successive stages in a preferred method for making a first preferred device in accordance with the invention; and FIG. 4 is a cross section of a conventional bipolar static induction transistor.

DETAILED DESCRIPTION OF PREFERRED EMBODIMENTS

In the Figures, like features are designated by the same numerals.

Figure 1:
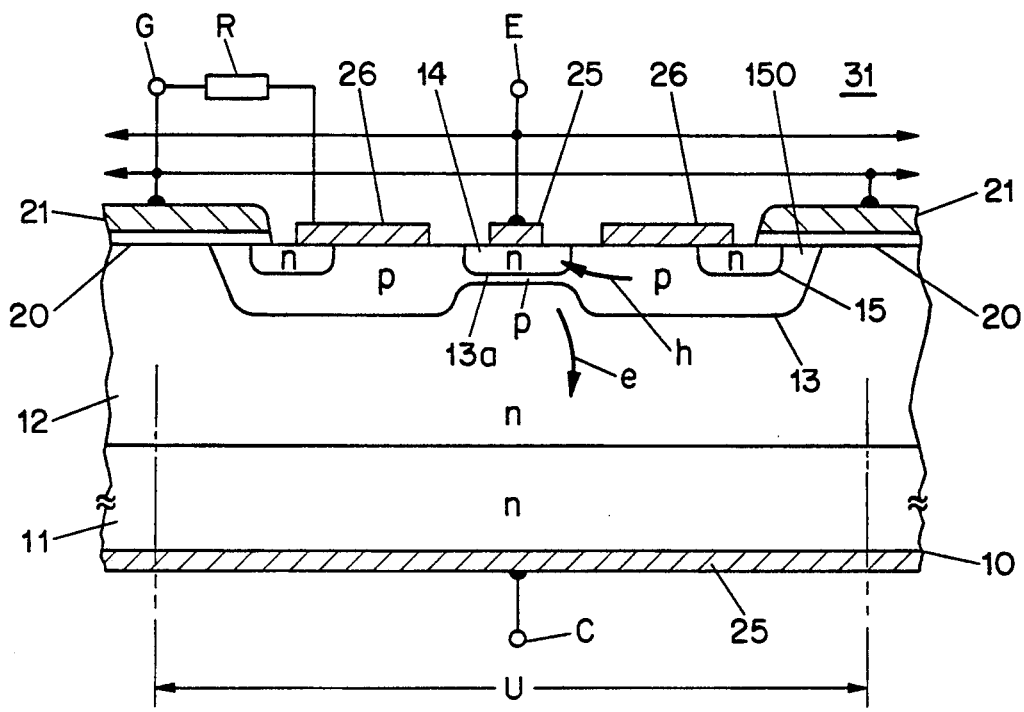
FIG. 1 is a cross section of a bipolar static induction transistor in accordance with a preferred first embodiment of the invention.

FIG. 1 shows a unit structure, U, of a BSIT 31 in accordance with a preferred first embodiment of the invention. The BSIT 31 may include multiple unit structures U, repeated a desired number of times in the horizontal direction in FIG. 1 and connected in parallel. The semiconductor substrate 10 includes an n-type epitaxial layer 12 serving as collector region, formed over an n-type substrate region 11. The region 12 is formed to a thickness of several tens of micrometers, depending on the withstand voltage required for the BSIT 31, having a relatively low impurity concentration of about $10^{13}$ atoms/cm$^3$. The n-type substrate region 11 has a thickness of several hundred micrometers, with a fairly high impurity concentration of about $10^{18}$ atoms/cm$^3$.

A base region 13 is formed in an insular form by diffusing p-type impurities from the surface of the n-type collector region. The base region 13 is disposed as a lateral pair in a unit structure U as shown. The base region diffusion depth is normally 5 to 10 micrometers and may differ somewhat depending on the desired withstand voltage. Base region impurity concentration is preferably somewhat on the high side, e.g., $10^{18}$ to $10^{19}$ atoms/cm$^3$.

An n-type emitter region 14 is formed by diffusion between the two lateral portions of the base region 13. The impurity concentration for the emitter region 14 should be greater than $10^{19}$ atoms/cm$^3$, and the diffusion depth may be about half of that for the base region 13 or slightly less. If a single base region 13 is included in a unit structure U, the emitter region 14 is formed by diffusion in the surface of the collector region 12 adjacent to the emitter region 14. This also applies to the preferred second embodiment described below.

In the preferred first embodiment, an n-type source region 15 is diffused in the p-type base region 13 in an insular form. The source region 15 can be diffused simultaneously with the emitter region 14 and with the same impurity concentration and diffusion depth. A gate 21 is disposed on the portion of the base region 13 between the source region 15 and the surface of the collector region 12 via a thin gate-oxide film 20, whereby a field effect transistor (FET) is formed as a part of the unit structure U. This FET uses the source region 15 as the source, the collector region 12 as the drain, and the surface of the base region 13 as the forming face of the channel 150.

A gate terminal G is connected to the gate 21. A collector terminal C is connected to the substrate 11 of the collector region 12 via an aluminum electrode film 25. An emitter terminal E is connected to the emitter region 14. The base region 13 and the source region 15 are short-circuited by electrode surface films 26, formed at the same time as the electrode film 25.

Turn-on from an initial off state is by voltage control at gate 21. A positive control voltage is applied to gate 21 to put the channel 150 below the gate 21 into a conductive state, the channel 150 being of an on-type in this embodiment. From the collector region 12, applied with a positive source voltage from the collector terminal C, a current flows into the source region 15 and also, as a base current, through the electrode film 25 into the base region 13. A hole current h is supplied from this p-type base region 13 into the emitter region 14, passing through the p-n junction between the regions 13 and 14 in the forward direction. Most of an electron current e generated from the emitter region 14 in correspondence with the hole current h flows out into the collector region 12, making the BSIT 31 conducting. As the n-type channel 150 is electron conductive, an electron current flows into the electrode film 26, and this results in a hole current of the same strength.

When the gate control voltage is reduced below a reversal voltage, the channel 150 becomes non-conductive, interrupting the current flow into the base region 13 from the collector region 12 so that a potential difference is applied between the base region 13 and the collector region 12. The depletion region expands into the collector region 12 from the p-n junction between the base region 13 and the collector region 12, narrowing the current path and thereby turning the BSIT 31 off.

In the operation of the preferred first embodiment as described, voltage control is used at the gate 21 to switch the channel 150, turning the BSIT 31 on and off while controlling the base current flowing into the base region 13 from the collector region 12. However, the BSIT 31 according to this first embodiment takes somewhat longer for turn-off than for turn-on, with possible failure in the turn-off operation in the worst case. This is due to the potential in the base region 13, tending to float when the channel 150 is made non-conductive for a turn-off operation, so that the current tends to leak from the collector region 12 to the base region 13 through the p-n junction in a reverse direction, flowing forcibly as a base current. If, at the time of current interruption, the recovery voltage of a circuit incorporating the BSIT 31 is high, the base current will not vanish, and turn-off will fail. This may be prevented, for example, by drawing out a lead from the electrode film 26 in contact with the base region 13, and connecting the lead with the gate terminal G via a resistance R, as shown by the fine line in FIG. 1. Raising the value of the resistance R can prevent excessive floating of the potential at the base region 13 without impairing the voltage control of the gate 21.

Another preventive measure lies in forming an auxiliary base region 13a of the same p-type as the base region 13, between the emitter region 14 and the collector region 12. The auxiliary base region 13a may have a very shallow depth (1-2 micrometers, for example) and an impurity concentration as low as $10^{15}$ to $10^{16}$ atoms/cm$^3$. This preferred concentration level is one to two orders of magnitude lower than that for the base region 13. When provided with an auxiliary base region 13a, the BSIT 31 includes a vertical NPN transistor having an extremely narrow base width, for more reliable turn-off.

Figure 2:
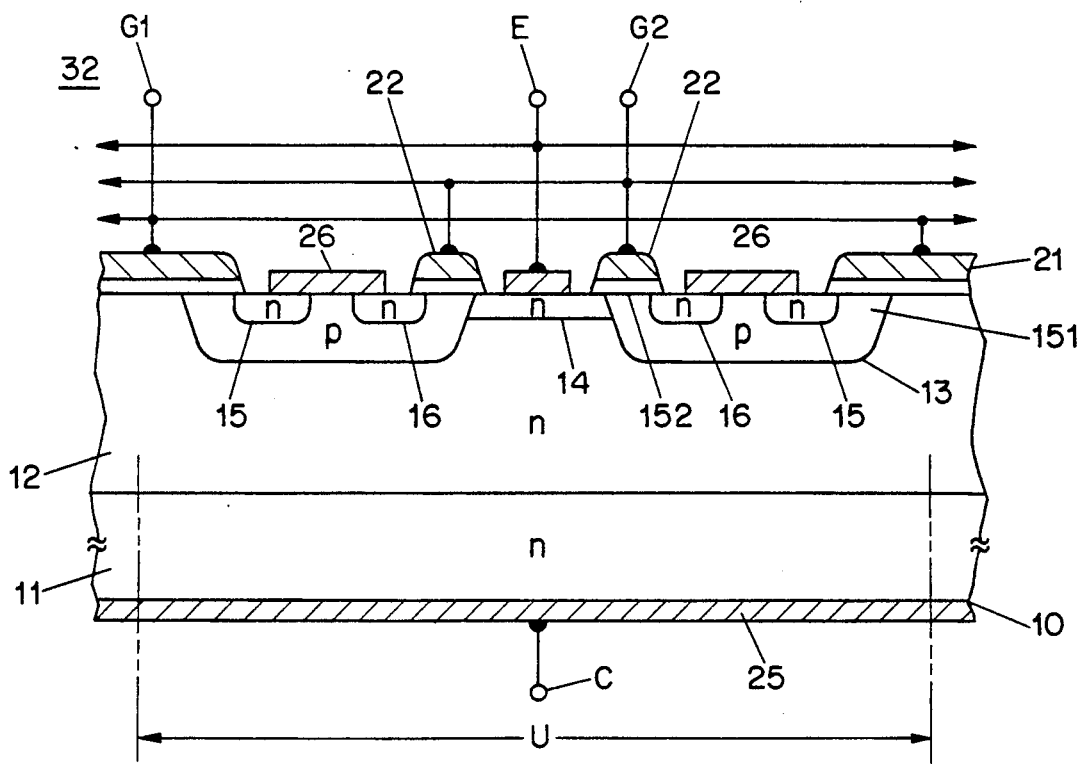
FIG. 2 is a cross section of a bipolar static induction transistor in accordance with a preferred second embodiment of the invention.

In the BSIT 32 shown in FIG. 2, representing a preferred second embodiment of the invention, respective first and second gates 21 and 22 are provided for voltage control of turn-on and turn-off. For these functions, in addition to the source region 15, an n-type insular drain region 16 is formed in the base region 13. In the resulting structure, the base region 13, the source region 15, and the drain region 16 are short-circuited together near the surface portion of the base region 13 via the electrode film 26. The first gate 21 is similar to the one in the preferred first embodiment of the invention. The second gate 22 is disposed above the base region 13 between the emitter region 14 and the drain region 16. The first and second gate terminals G1 and G2 are connected to gates 21 and 22, respectively.

In operation, the voltage applied to the first gate 21 and the second gate 22 are controlled so that the channels 151 and 152 located below the respective gates are alternatingly made conductive and non-conductive. To turn the BSIT 32 on, channel 151 is made conductive and channel 152 is made non-conductive to supply the base current from the channel region 12 to the base region 13. To turn the BSIT 32 off, channel 152 is made conductive and channel 151 non-conductive.

The charge current generated upon expansion of the depletion region from the p-n junction between the collector region 12 and the base region 13 in response to recovery of the voltage between the region 12 and the region 13, or the displacement current for the carriers in the depletion region, as well as the carriers remaining in the base current in the base region 13, are drawn into the emitter region 14 through the conductive channel 152. The current flowing during this turn-off operation is an electron current through the n-type channel 152, and this current is not a base current. Therefore, this current does not induce an emitter current. Rather, it is rapidly drawn into the emitter region 14 through the channel 152, which has low resistance, without being influenced by the p-n junction between the base region 13 and the emitter region 14. Consequently, turn-off of the BSIT 32 is enhanced even if the recovery voltage rises quickly when the current is interrupted in the circuit.

In the BSIT 32, it is preferable to form the source region 15 and the drain region 16 by diffusion at the same time as the emitter region 14, with the regions 15 and 16 having essentially the same impurity concentration and the same depth. Alternatively, a common source/drain region may be formed by diffusion with a window that exposes the base region in the center. The unit structure U shown in FIG. 2 may be repeated a desired number of times along the lateral direction in the semiconductor substrate 10 and connected in parallel.

FIGS. 3(a)-3(d) illustrate a method for manufacturing the BSIT 31 of FIG. 1. As shown in FIG. 3(a), gates 21 are formed of polycrystalline silicon on the surface of the semiconductor substrate 10 via the gate oxide film 20. Then, p-type impurities such as boron are implanted, using the photoresist films 40 as a mask, as shown by the arrows designated I in FIG. 3(a). A very thin oxide film 41 is disposed at the center, corresponding to the auxiliary base region 13a in the BSIT 31, thereby reducing the impurity concentration for this region. In the step illustrated by FIG. 3(b), the impurities that have been implanted in the previous step are thermally diffused to form the p-type base region 13 and the auxiliary base region 13a. The region 13a has a more shallow depth and a lower impurity concentration as compared with the base region 13.

Next, in the step illustrated by FIG. 3(c), n-type impurities such as phosphorus are implanted, using the gate 21 and the photoresist film 42 as a mask, similar to the step in FIG. 3(a). Then, in the step shown in FIG. 3(d), the n-type emitter region 14 and the source region 15 are formed by thermally diffusing the impurities implanted in the step shown in 3(c), to have the same concentration level and the same depth. Thereafter, the surface may be covered with an oxide film, and the aluminum electrode films 25 and 26 are then deposited to complete the structure of FIG. 1.

As indicated, all the semiconductor regions for the BSIT 31 can be formed with only two implantation steps and a thermal diffusion process. The gates 21 are disposed on the surface of the semiconductor substrate 10, which gates are utilized as part of the masks to form the base region 13 by implantation of the p-type impurity followed by a thermal diffusion step. The emitter region 14 and the source region 15 are simultaneously formed by implantation of the n-type impurity followed by a thermal diffusion step. Preferred manufacture of the device of FIG. 2 differs only in that the drain region 16 and the emitter region 14 are formed simultaneously, as no auxiliary region 13a is required.

Preferred embodiments of the invention have several significant advantages over a conventional BSIT, resulting in enhanced practicality, convenience of use, and scope of application, particularly due to high withstand voltages, reliable large current-carrying capability, and long-term operational reliability. These advantages may be attributed to low output impedance characteristics of the BSIT as a bipolar transistor, as well as to high input impedance characteristics. High input impedance is realized by gate-voltage control of a field effect transistor component. Current concentration in individual unit structures is substantially prevented, thereby minimizing potential damage to the transistor due to uneven supply of base current. Uniformity of current supply to each unit structure is achieved by controlling the voltage applied via respective gates to each of the unit structures, the required number of which are integrated in one semiconductor substrate and connected in parallel to increase the current-carrying capacity of the BSIT.

While the present invention has been described with respect to specific exemplary embodiments thereof, it will be appreciated by those skilled in the art that various modifications and alterations may be made to the exemplary embodiments without departing from the spirit or scope of the invention as defined in the appended claims.

I claim:

1. A bipolar transistor, comprising:
   a collector region of first conductivity type having first and second surfaces;
   a base region of second conductivity type having first and second surfaces formed in an insular form at the first surface of the collector region;
   an emitter region of first conductivity type adjoining the base region formed at the first surface of the collector region;
   a source region of first conductivity type formed in an insular form at the first surface of the base region which is electrically coupled with the source region; and
   a gate disposed on a gate insulator which is formed on a portion of the base region between the first surface of the collector region and the source region;
   wherein the current flowing between the collector region and the emitter region is controlled by a voltage applied to the gate with the base region and the source region short-circuited together.

2. The bipolar transistor of claim 1, wherein the base region and the source region are short-circuited together by an electrode film disposed on the base region and the source region.

3. The bipolar transistor of claim 2, further comprising a variable resistor connected between the gate and the electrode film.

4. The bipolar transistor of claim 1 further comprising an auxiliary base region of second conductivity type between the emitter region and the collector region, the auxiliary base region being contiguous with the base region.

5. The bipolar transistor of claim 4, wherein the depth of said auxiliary base region is in the range from 1 to 2 micrometers, and the impurity concentration of the auxiliary base region is at least one order of magnitude lower than the impurity concentration of the base region.

6. The bipolar transistor of claim 1, further comprising:
   a drain region of first conductivity type formed in an insular form at the surface portion of the base region located between the emitter region and the source region; and
   a second gate disposed on a gate insulator which is formed on a portion of the base region between the emitter region and the drain region;
   wherein the current flowing between the collector region and the emitter region is controlled by a voltage applied to the first and second gates with the source region and the drain region short-circuited together with the base region.

* * * * *